United States Patent [19]

Ogawa

[11] Patent Number: 4,740,922
[45] Date of Patent: Apr. 26, 1988

[54] SEMICONDUCTOR MEMORY DEVICE HAVING A READ-MODIFY-WRITE CONFIGURATION

[75] Inventor: Junji Ogawa, Tokyo, Japan

[73] Assignee: Fujitsu Limited, Kawasaki, Japan

[21] Appl. No.: 788,398

[22] Filed: Oct. 17, 1985

[30] Foreign Application Priority Data

Oct. 23, 1984 [JP] Japan .................. 59-221165

[51] Int. Cl.[4] ............................. G11C 11/40
[52] U.S. Cl. .................... 365/189; 365/238
[58] Field of Search ............ 365/189, 230, 238; 364/200

[56] References Cited

U.S. PATENT DOCUMENTS

| 3,763,480 | 10/1973 | Weimer | 365/238 |
|---|---|---|---|
| 4,272,829 | 6/1981 | Schmidt et al. | |
| 4,276,609 | 6/1981 | Patel | |
| 4,422,161 | 12/1983 | Kressel et al. | |
| 4,429,375 | 1/1984 | Kobayashi | |

FOREIGN PATENT DOCUMENTS

| 334662 | 12/1973 | Austria . |
| 0040001 | 4/1980 | European Pat. Off. . |
| 0056240 | 7/1981 | European Pat. Off. . |
| WO82/02615 | 8/1982 | PCT Int'l Appl. . |

OTHER PUBLICATIONS

European Search Report EP 85307600.8, Apr. 1986.

Primary Examiner—Terrell W. Fears
Attorney, Agent, or Firm—Staas & Halsey

[57] ABSTRACT

A semiconductor memory device having a read-modify-write (RMW) configuration suitable for modifying a large number of data with high speed and a simple circuit. The RMW configuration includes a data input and output circuit (11, 14, 16) for simultaneously storing or reading a plurality of data into or from the memory cells, a data output circuit (10, 12, 13) for serially reading a plurality of data from the memory cells, and data modification circuits (15) for successively receiving the plurality of data from the data output circuit, modifying the received data if necessary and transmitting the modified data to the data input and output circuit.

11 Claims, 8 Drawing Sheets

SEMICONDUCTOR MEMORY DEVICE HAVING A READ-MODIFY-WRITE CONFIGURATION

BACKGROUND OF THE INVENTION

1. Field of the Invention

The present invention relates to a semiconductor memory device and, more particularly, to a semiconductor memory device for performing a high speed read-modify-write (hereinafter referred to as an RMW) operation for a large number of data.

2. Description of the Related Art

Demand has arisen for effectively writing image data in or reading image data from an image processing memory or the like and for effectively performing a high-speed RMW operation, i.e., the storage contents are read out from the memory, the read out data is modified, and the modified data is restored in the memory. A typical RMW application is exemplified by color inversion for inverting a color currently displayed on a display unit with a given relationship and providing pattern emphasis emphasizing a specific pattern.

A conventional RMW scheme is applied in such a manner that data is read out using an RMW function of a dynamic-random access memory (D-RAM) device, the read out data is modified by an external circuit, and the modified data is restored in the corresponding memory cell. However, the conventional RMW scheme requires a relatively long processing time defined by the operating cycle of the D-RAM device, resulting in inconvenience.

SUMMARY OF THE INVENTION

It is an object of the present invention to provide a semiconductor memory device for performing a high-speed RMW operation for a large number of data for selected memory cells.

According to the present invention, there is provided a semiconductor memory device including: a random access memory cell array including a plurality of memory cells; and a RMW configuration. The RMW configuration includes a data access circuit, operatively connected to the memory cell array, and includes one or more register circuit arrays, each having a data input and output circuit for simultaneously storing or reading a plurality of data into or from the memory cells, and a data output circuit for serially reading a plurality of data from the memory cells. The RMW configuration also includes one or more data modification circuits, each operatively connected to the corresponding register circuit array of the data access circuit, and, successively, receiving the plurality of data from the data output circuit, modifying the received data in a predetermined logical manner and transmitting the modified data to the data input and output circuit. The data access circuit may include a circuit for designating a predetermined range of data output from the data output circuit and data restore in the data input circuit, to perform a predetermined range of data modification.

BRIEF DESCRIPTION OF THE DRAWINGS

Other objects and features of the present invention will be described below in detail with reference to the accompanying drawings, in which.

DESCRIPTION OF THE PREFERRED EMBODIMENTS

Figure 1:
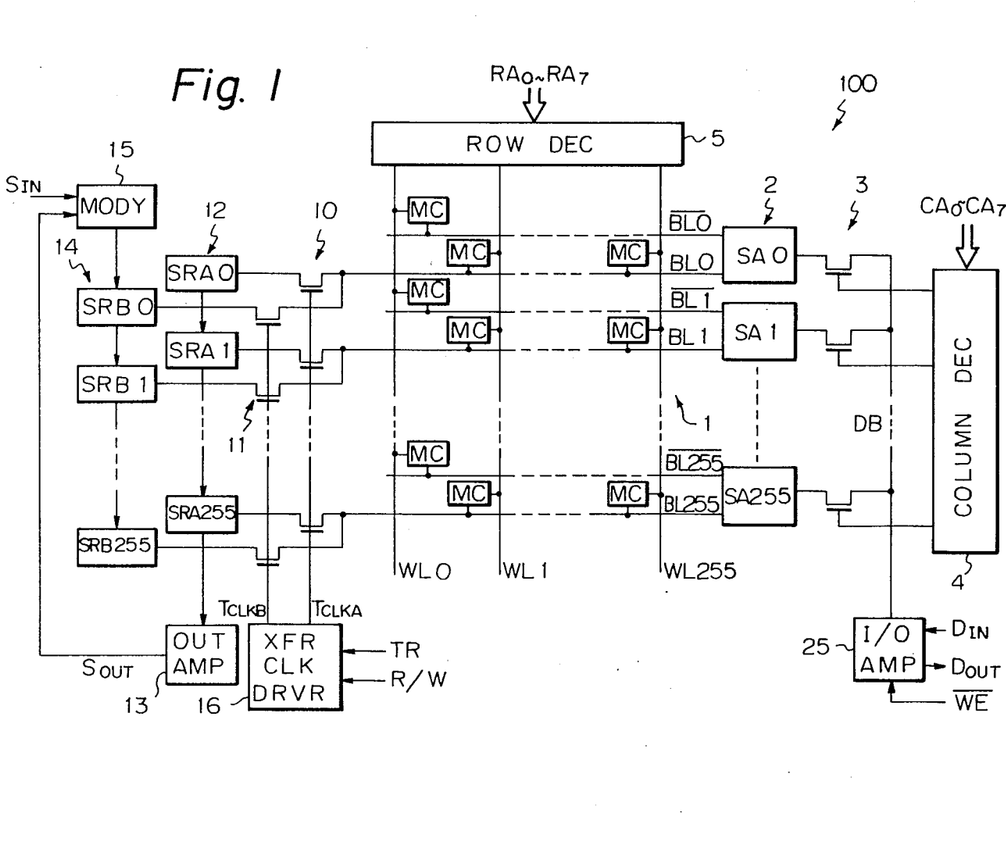
FIG. 1 is a block diagram of a semiconductor memory device according to an embodiment of the present invention.

FIG. 1 is a block diagram of a semiconductor memory device according to a first embodiment of the present invention. The semiconductor memory device in FIG. 1 has a plurality of dynamic RAM (D-RAM) cells (MC) 1 arranged in a matrix form, a row decoder 5 for selecting word lines $WL_0$ to $WL_{255}$ of the memory cells in response to row address signals $RA_0$ to $RA_7$. A sense amplifier array 2 of sense amplifiers $SA_0$ to $SA_{255}$ connected to bit lines $\overline{BL_0}$ to $\overline{BL_{255}}$ and $BL_0$ to $BL_{255}$ is included along with a gate array 3 including 256 gates, a column decoder 4 for selecting one of the gates of the gate array 3 in accordance with column address signals $CA_0$ to $CA_7$. Also included are a data bus DB connected to one gate of the gate array 3 with is selected by the column decoder 4 and an I/O amplifier 25 connected to the data bus DB. This arrangement is the same as the conventional D-RAM configuration. The same operation as in the conventional D-RAM device can be also applied to the semiconductor memory device of the first embodiment. It should be noted that the D-RAM device of the first embodiment has a memory capacity of 64 kbits (=256 bits×256 bits).

The semiconductor memory device in FIG. 1 further has a data read shift register array 12 including 256 series-connected shift registers $SRA_0$ to $SRA_{255}$ connected to the bit lines $BL_0$ to $BL_{255}$ through a first transfer gate array 10 including 256 transfer gates, and a data write shift register array 14 having 256 series-connected shift registers $SRB_0$ to $SRB_{255}$ and connected to the bit lines $BL_0$ to $BL_{255}$ through a second transfer gate array 11 including 256 transfer gates. An output amplifier 13 is connected to the read shift register array 12. An output signal $S_{OUT}$ from the output amplifier 13 is supplied together with a modifying input signal $S_{IN}$ from a central processor unit (CPU), not shown, to the modifying circuit 15. An output signal from the modifying circuit 15 is supplied to the write shift register array 14.

Figure 2:
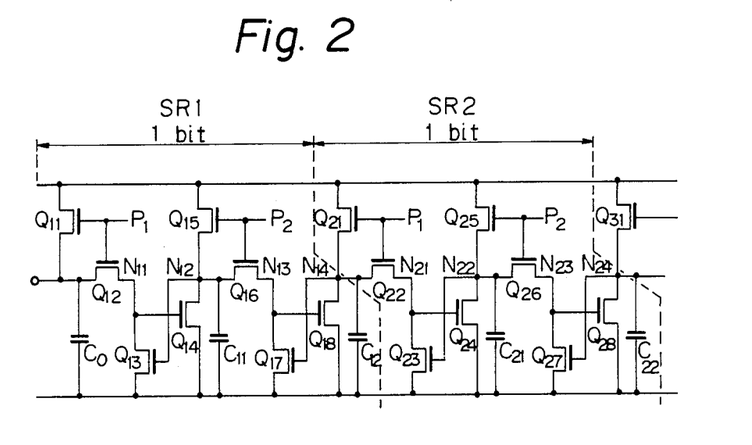
FIG. 2 is a circuit diagram of shift registers in the device shown in FIG. 1.
Figure 3:
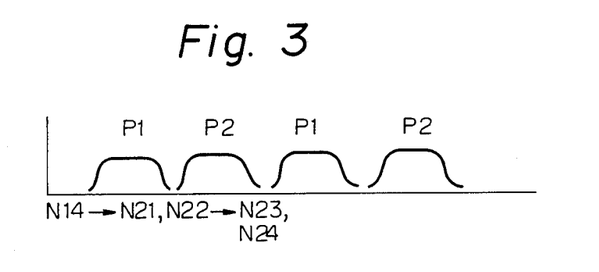
FIG. 3 is a timing chart for explaining the operation of the shift registers shown in FIG. 2.

A typical example of the read and write shift registers $SRA_0$ to $SRA_{255}$ and $SRB_0$ to $SRB_{255}$ of FIG. 1 is a two-phase ratio type shift register as shown in FIG. 2. A timing chart of the two-phase ratio type shift register is illustrated in FIG. 3. In the shift register $SR_2$, a value at a node $N_{14}$ of the preceding stage of the shift register $SR_1$ is transferred as master data, and a transistor $Q_{22}$ is turned ON in response to a clock pulse $P_1$ to receive the master data at a node $N_{21}$. When a voltage level at the node $N_{21}$ is set at logic "1", the level at a node $N_{22}$ is inverted. In order to perform a slave transfer, a transistor $Q_{26}$ is turned ON in response to a clock pulse $P_2$ to set the level at a node $N_{23}$ to be equal to that at the node $N_{22}$. The signal level at a node $N_{24}$ is inverted in accordance with the signal level at the node $N_{23}$. Therefore, the data can be shifted bit by bit in each shift register.

The operation of the semiconductor memory device in FIG. 1 will be described hereinafter. The D-RAM side is not synchronized with the shift register side and operates independently thereof. The D-RAM can be accessed in a conventional manner. At the same time, when the D-RAM is held in a nonaccess mode, an RMW operation can be performed in the following manner.

In the RMW mode, a transfer instruction TR and a read instruction R/W=0 are supplied to a transfer clock driver 16, and the driver 16 generates a clock signal $T_{CLKA}$. The transfer gate array 10 is turned ON in response to the clock signal $T_{CLKA}$, so that data, on the bit lines $BL_0$ to $BL_{255}$ connected to the accessed word line $WL_i$, is simultaneously supplied to the read shift register array 12. The data in the shift register array 12 is then consecutively read as an output signal $S_{OUT}$ by the output amplifier 13, supplying the read signal $S_{OUT}$ to the modifying circuit 15.

Figure 4:
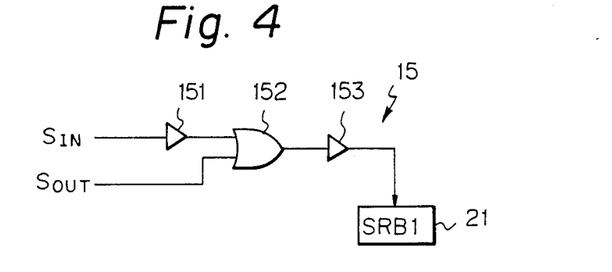
FIG. 4 is a circuit diagram of a modifying circuit in the device shown in FIG. 1.
Figure 5A:
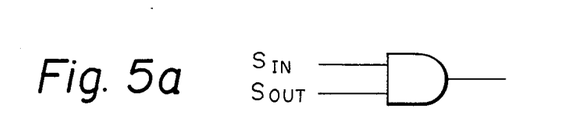
FIGS. 5a to 5c are circuit diagrams showing modifications of the circuit of FIG. 4, respectively.
Figure 5B:
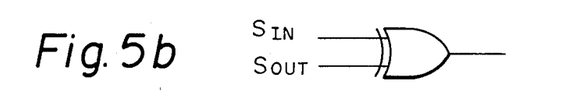
Figure 5C:
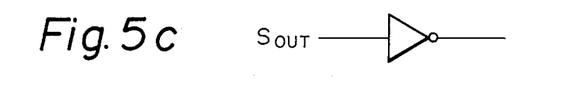

As shown in FIG. 4, the modifying circuit 15 includes an amplifier 151 for amplifying the input signal $S_{IN}$, an OR gate 152 for producing a logical OR of the signals $S_{IN}$ and $S_{OUT}$, and an amplifier 153 for amplifying an output from the OR gate 152. The original signal (the signal $S_{OUT}$) is logically ORed with the input signal $S_{IN}$ in the circuit of FIG. 4. However, the data modification is not limited to the logic sum (OR), but can be extended to a logic product (FIG. 5a), a logical exclusive OR (FIG. 5b) or a simple inversion (FIG. 5c), etc.

The modified signal is stored in the write shift register array 14. When the modified signals are loaded into all the shift registers, the transfer instruction TR and the write instruction R/W=1 are supplied to the transfer clock driver 16. The gate array 11 is turned ON in response to the clock signal $T_{CLKB}$ from the driver 16. The contents in the shift register array 14 are stored in the memory cells connected to the above-mentioned word line $WL_i$.

In this case, when the data in the memory cells is used only for display, an output amplifier (not shown) connected to the end stage $SRB_{255}$ of the shift register array 14 serially outputs the data to be displayed on the display unit while the gate array 11 is kept OFF.

As described above, a simultaneous high-speed RMW operation can be performed for memory cells connected to a given word line.

In the above embodiment, two shift register arrays are used for the RMW operation. However, the RMW operation can be performed by a single shift register array. In this case, the single shift register array is connected to the word lines through a single transfer gate array so as to achieve write/read access.

The semiconductor memory device mentioned above performs an RMW operation for all shift registers. In general, however, the RMW operation is performed for desired bit lines. An embodiment suitable for this application will be described hereinafter.

Figure 6:
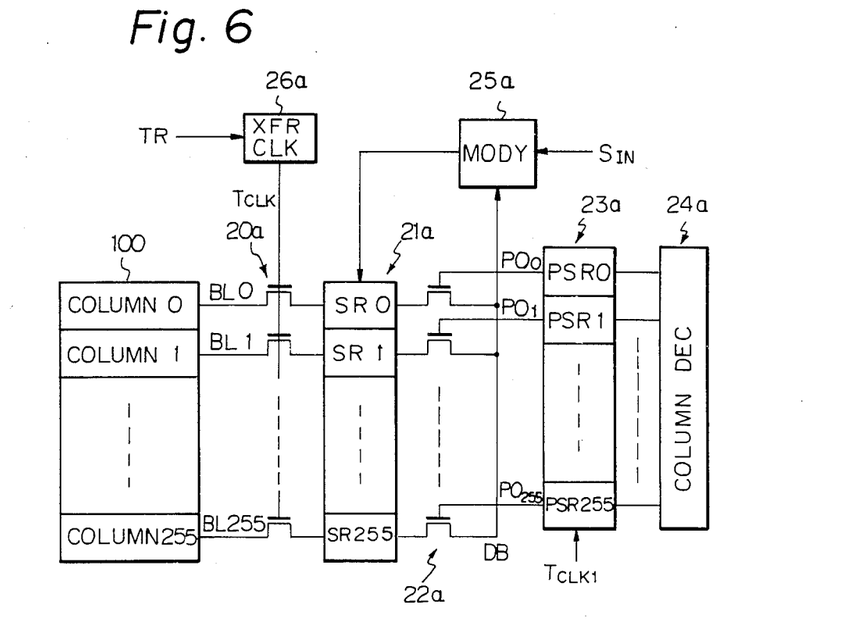
FIG. 6 is a block diagram of a semiconductor memory device according to another embodiment of the present invention.

FIG. 6 shows an arrangement of a semiconductor memory device according to a second embodiment of the present invention. Reference numeral 100 denotes a circuit corresponding to the D-RAM device (FIG. 1) including the memory cell array 1, the sense amplifier array 2, the gate array 3, the column decoder 4, the row decoder 5, and the I/O amplifier 25 so as to schematically show the connections between the respective components with the bit lines in units of columns.

A shift register array 21a is connected to the bit lines $BL_0$ to $BL_{255}$ through a transfer gate array 20a including 256 transfer gates. The output terminals of the shift register array 21a are connected to the corresponding input terminals of an output gate array 22a including 256 gates, i.e., transistors. The drains of the transistors of the output gate array 22a are connected to a data bus DB. The data bus DB is connected to a modifying circuit 25a. A pointer shift register (PSR) array 23a is arranged to control the respective gates of the output gate array 22a. A column decoder 24a is arranged to load a value into the pointer shift register array 23a.

Figure 7:
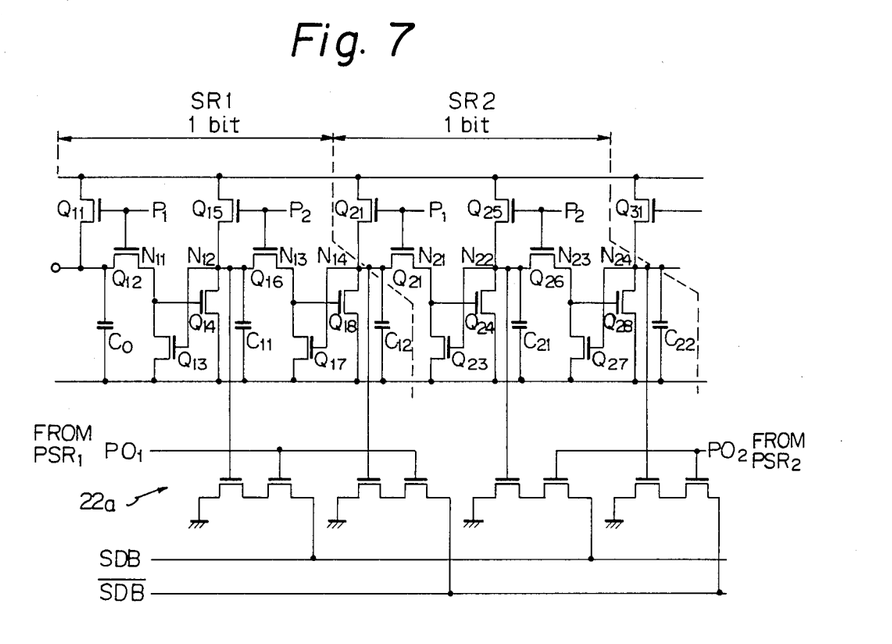
FIG. 7 is a circuit diagram showing connections between the shift register and a data bus in the device shown in FIG. 6.
Figure 8:
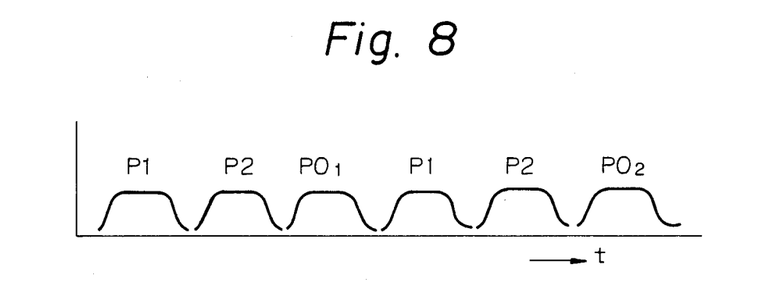
FIG. 8 is a timing chart for explaining the operation of the circuit arrangement shown in FIG. 7.

Each shift register in the shift register array 21a may be the same as that shown in FIG. 3. One arrangement representing the connections between the shift registers $SR_1$ and $SR_2$, the output gate 22a, and the $PSR_1$ and $PSR_2$ is shown in FIG. 7. The timing chart of the arrangement of FIG. 7 is shown in FIG. 8. The data is shifted bit by bit in response to the clock signals P1 and P2 in the same manner as in the first embodiment. According to the second embodiment, in addition, the contents in the shift registers appears on the data bus DB consisting of data buses SDB and $\overline{SDB}$ in response to a pointer instruction signal $PO_i$ from the pointer shift register array 23a.

Figure 9:
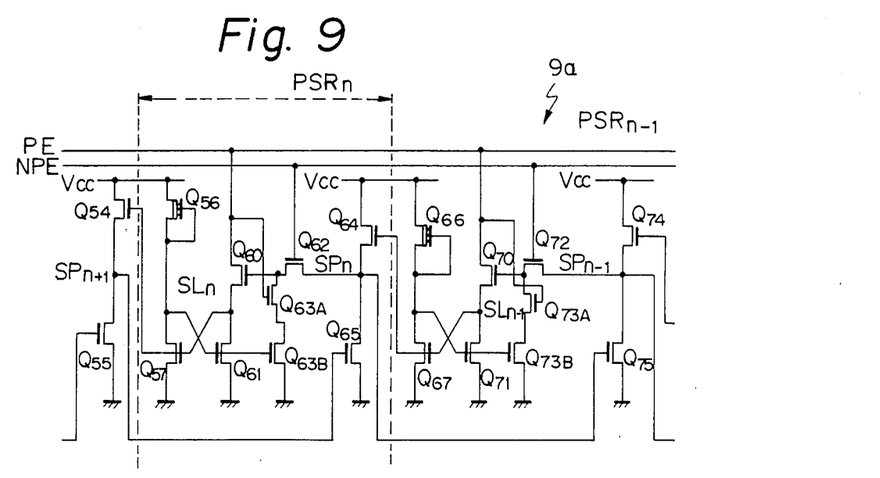
FIG. 9 is a circuit diagram of pointer shift registers in the device of FIG. 6.
Figure 10:
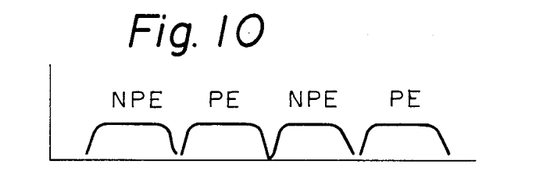
FIG. 10 is a timing chart for explaining the operation of the registers shown in FIG. 9.

FIG. 9 is a circuit diagram of a part of the pointer shift register array 23a. The n-th pointer shift register $PSR_n$ consists of a depletion-type transistor $Q_{56}$ and enhancement-type transistors $Q_{57}$ and $Q_{60}$ to $Q_{65}$. Other pointer shift registers are applied in the same way. FIG. 10 is a view of waveforms of a clock signal $T_{CLK1}$ for driving the pointer shift register array 23a. The clock pulse signal $T_{CLK1}$ shown in FIG. 10 for driving the pointer shift registers includes a first pulse PE and a second pulse NPE, which are phase-shifted by 180° from each other.

The operation of the pointer shift registers will now be described. First, when the pulse PE is at a high level, it is assumed that an output $SL_{n-1}$ at the (n−1)-th pointer shift register $PSR_{n-1}$ is the high level or logical "1", and all other outputs $SL_0$ to $SL_{n-2}$ and $SL_n$ and $SL_{255}$ are at a lower level or logical "0". Due to the application of the high level voltage of the output $SL_{n-1}$, the transistor $Q_{64}$ in the n-th pointer shift register $PSR_n$ is turned ON, with a resultant charging-up of node $SP_n$ to the high level. By applying the high level signal at the node $SP_n$ to a gate of a transistor $Q_{75}$ in the pointer shift register $PSR_{n-1}$, the transistor $Q_{75}$ is turned ON, resulting in the low level at the node $SP_{n-1}$. The states at the node $SP_n$ and $SP_{n-1}$ are maintained as is when the pulse PE becomes low. When the pulse NPE becomes high, the transistors $Q_{62}$ and $Q_{72}$ are turned ON, applying the high level signal at the node $SP_n$ to a gate of the transistor $Q_{60}$ and the low level signal at the node $SP_{n-1}$ to a gate of the transistor $Q_{70}$. The signals applied to the respective gates of the transistors $Q_{60}$ and $Q_{70}$ are maintained if the pulse NPE becomes low. Again, by applying a pulse PE having a high level to the pointer shift registers $PSR_n$ and $PSR_{n-1}$, the signal levels at nodes $SL_n$ and $SL_{n-1}$ are respectively rendered high and low. As a result, a unique "1" a bit of data is transferred from the pointer shift register $PSR_{n-1}$ to the adjacent pointer shift register $PSR_n$.

The transistors $Q_{73A}$ and $Q_{73B}$ prevent the application of the high voltage to a gate of the transistor $Q_{70}$, to securely maintain the node $SL_{n-1}$ at the low level. As the gate of the transistor $Q_{60}$ is supplied with a sufficiently high voltage, the gate voltage of the transistor $Q_{63B}$ is rapidly changed to the low level together with a change of the node $SL_n$ to a high level.

The transistors $Q_{56}$, $Q_{57}$, and $Q_{61}$ in the pointer shift register $PSR_n$ and the transistors $Q_{66}$, $Q_{67}$, and $Q_{71}$ are used for preventing malfunctions which may arise due to the floating signal level, i.e., low level, because many nodes SL are at the low level. The depletion transistors $Q_{56}$ and $Q_{66}$ may be replaced by resistors.

By applying one clock signal $T_{CLK1}$ consisting of the pair of pulses PE and NPE to the pointer shift register array 23a, the 1 bit data held in a first pointer shift register is transferred to the next pointer shift register and that first pointer shift register is reset. This is successively effected in response to application of the clock signal $T_{CLK1}$. The pointer shift registers $PSR_0$ to $PSR_{255}$ feature a unique "1" bit shift therein.

In the embodiment, an arbitrary number of serial data appearing on the bit lines between the first bit line $BL_0$ and n-th bit line $BL_{n-1}$ can be successively output via the shift registers $SR_0$ to $SR_{n-1}$ and via the gate 22a, one of which is selected in response to the unique "1" bit shifting in the pointer shift register array 23a. Via the selected gate 22a, output data successively appear on the data bus DB, which may be output to the exterior of the device via an output amplifier (not shown) so that serial data for the display unit can be obtained. Alternatively, n-th pointer register $PSR_{n-1}$ may be set at logic "1" and held there while a desired number of shifts of the shift register array 21a is carried out. This operation also brings about serial data output of the desired number of bits via the data bus DB, but in a reverse direction to the data shift.

A modification circuit 25a is the same as that of the first embodiment.

The RMW operation of the semiconductor memory device according to the second embodiment in FIG. 6 will be described hereinafter. When a transfer instruction TR is set at logic "1", the gate array 20a is turned ON in response to a clock signal $T_{CLK}$ from the transfer clock driver 26a, so that the data are simultaneously transferred from 256 memory cells defined by the predetermined word line and the bit lines $BL_0$ to $BL_{255}$ to the register array 21a.

In one preferred mode of RMW operation, an output from an arbitrary one of the pointer shift registers $PSR_0$ to $PSR_{255}$ is set at logic "1", and the output gate connected to the "1" holding shift register of the register array 21a is turned ON, while data in the shift registers $SR_0$ to $SR_{n-1}$ is shifted by one bit in response to the clock pulse (not shown). At the same time, the output from the shift register $SR_{n-1}$ appears on the data buses SDB and SDB. The data on the data buses SDB and SDB, as reference data, is modified by the modifying circuit 25a together with the input signal $S_{IN}$. In the next cycle, the modified value is stored in the shift register $SR_0$, and at the same time the data in the shift registers $SR_0$ to $SR_{n-2}$ is shifted to the shift registers $SR_1$ to $SR_{n-1}$, so that the content of the shift register $SR_{n-2}$ appears on the data buses SDB and SDB.

The same modification operation as described above is performed for n bits.

In another mode of RMW operation, one of the pointer shift registers $PSR_0$ to $PSR_{255}$ is set at logic "1" and both the shift register arrays 21a and 23a are shifted synchronously. During operation, n shift registers $SR_0$ to $SR_{n-1}$ store the same data which is a result of the modification of the initially accessed data accessed by the one pointer register and modified by the input signal $S_{IN}$, with the number n corresponding to the number of shifts.

The modified contents need not be restored in the memory cells to update the contents thereof but can be supplied from the shift register array 21a to another device.

As may be apparent from the above description, a high-speed RMW operation can be performed for a predetermined range of 1st to nth bit lines $BL_0$ to $BL_{n-1}$, and the row decoder can be controlled to perform the RMW operation within a predetermined range of word lines.

In the above embodiment, data on the first to n-th bit lines are modified. However, any modification range of $n_1$-th to $n_2$-th bit lines can be selected.

Figure 11:
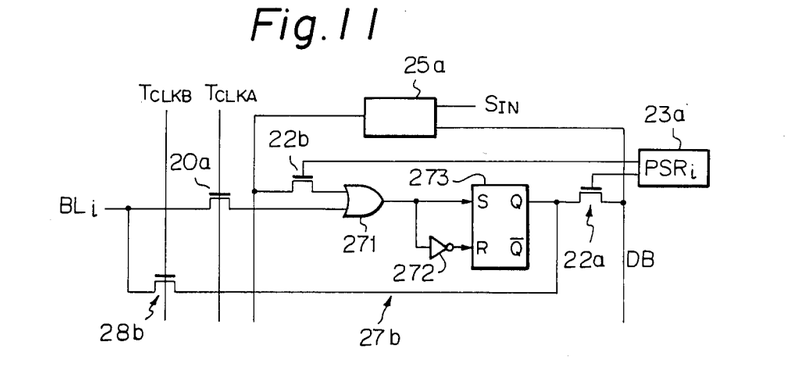
FIG. 11 is a circuit diagram showing a modification of the device shown in FIG. 6.

Still another embodiment of the present invention is shown in FIG. 11. In the circuit of FIG. 11, the shift register array 21a in FIG. 6 is replaced with a set-reset (R-S) flip-flop array. More specifically, instead of the shift register, a latch circuit 27b consisting of a flip-flop 273, an OR gate 271, and an inverter 272 is used together with gates 22b and 28b associated with the latch circuit 27b.

During operation, the contents of the memory cells on a bit line $BL_i$ are read out and stored in the flip-flop 273 through a gate 20a and the OR gate 271. An output Q of the flip-flop 273 is extracted by a pointer instruction $PO_i$ from the pointer shift register $PSR_i$ and placed on the data bus DB through the gate 22a. The data on the data bus DB is modified by the modifying circuit 25a. The modified content is stored in the flip-flop 273 through the gate 22b and the OR gate 271. The output Q of the modified and stored content is stored in the memory cell connected to the bit line $BL_i$ through the gate 28b in response to the clock signal $T_{CLKB}$.

Figure 12:
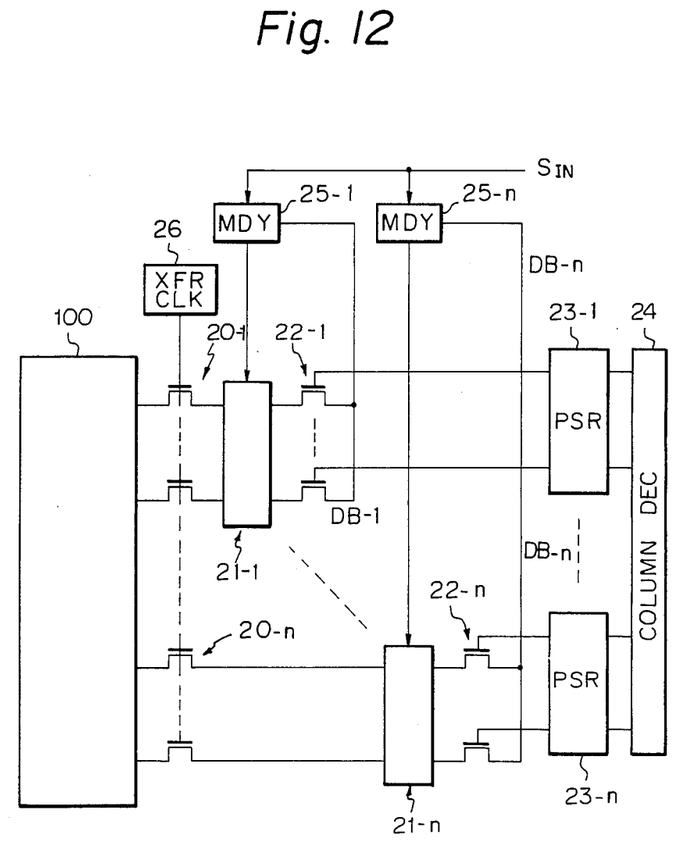
FIG. 12 is a block diagram of a semiconductor memory device according to still another embodiment of the present invention.

In order to increase the RMW operation time (increase its speed), an n-parallel RMW arrangement is shown in FIG. 12. The connection between the circuit of FIG. 12 and the memory cell array 100 is the same as described above. However, in order to perform the n-parallel RMW operation, n data buses DB-1 to DB-n and n modifying circuits 25-1 to 25-n are provided. Furthermore, n pointer register arrays 23-1 to 23-n can be operated in parallel with n register arrays 21-1 to 21-n. The pointer register arrays 23-1 to 23-n and the register arrays 21-1 to 21-n may be shift registers or flip-flops. The modifying circuits 25-1 to 25-n each are the same as the modifying circuit 25. The modifying circuit may include a circuit as shown in FIGS. 4 and 5a to 5c or others. The circuits shown in FIGS. 4 and 5a to 5c can be selectively used to perform various RMW operations.

Figure 13:
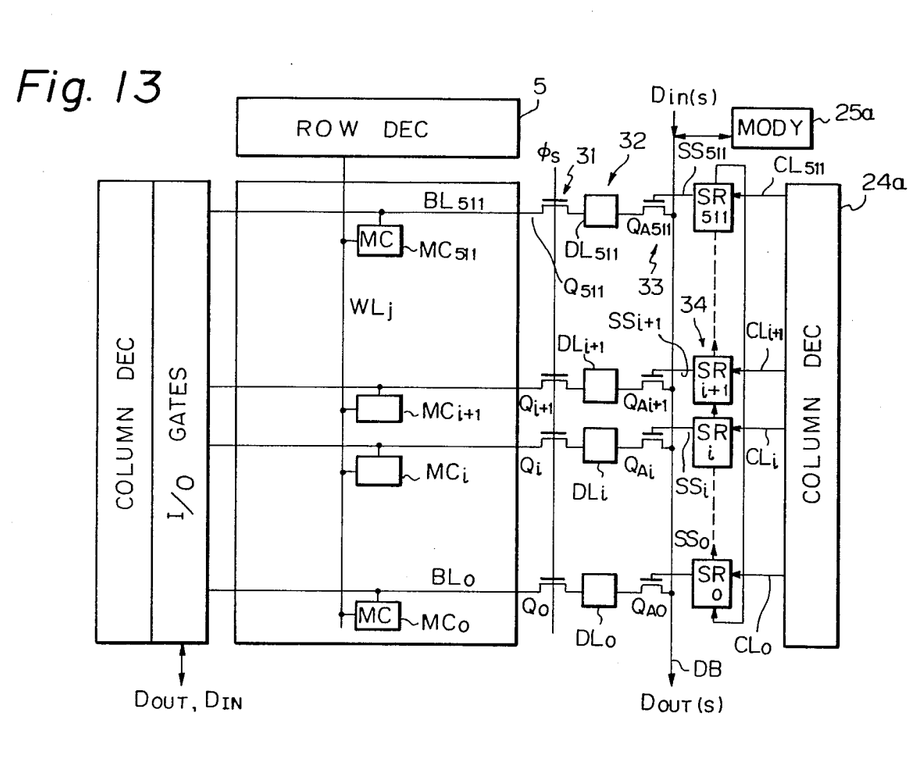
FIGS. 13 and 14 are block diagrams of semiconductor memory devices according to other embodiments of the present invention, respectively.
Figure 14:
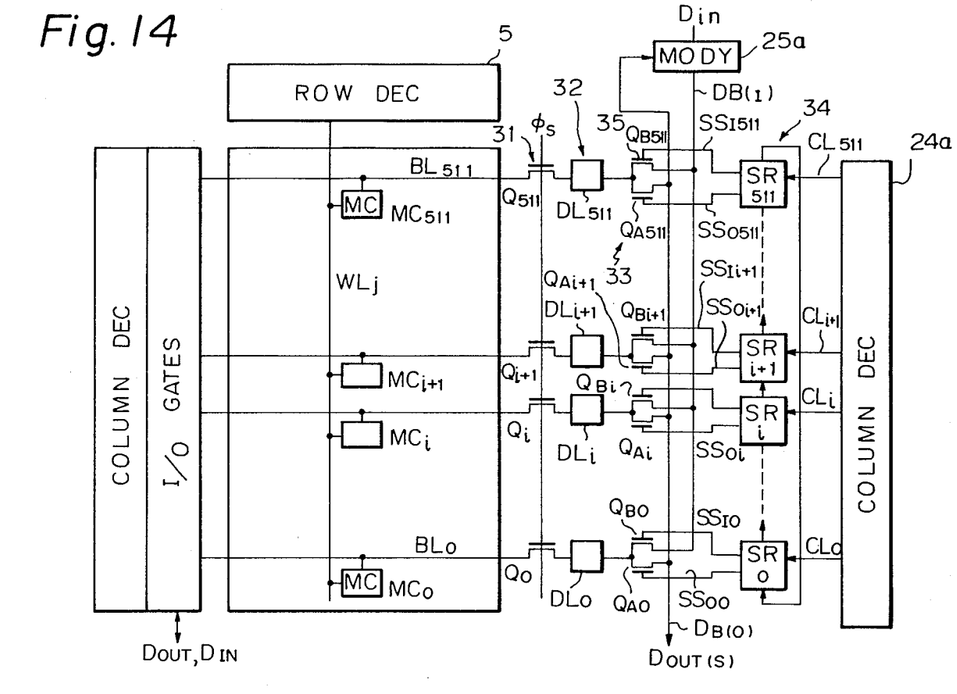

Embodiments for performing RMW operations for memory cells (m×n) of a specific area are shown in FIGS. 13 and 14, respectively.

The circuit in FIG. 13 has a gate array 31 consisting of gates $Q_0$ to $Q_{511}$ each having one end connected to a corresponding one of bit lines $BL_1$ to $BL_{511}$, a latch array 32 consisting of data latches $DL_0$ to $DL_{511}$ each having one end connected to the other end of the corresponding gates $Q_0$ to $Q_{511}$, a gate array 33 consisting of gates $Q_{A0}$ to $Q_{A511}$ each connected to the other end of the corresponding data latches $DL_0$ to $DL_{511}$, and a shift register array 34 consisting of shift registers $SR_0$ to $SR_{511}$ for controlling the gates of the gate array 33. The gate array 33 is connected to the data bus DB to which the modifying circuit 25a is connected. In this embodiment, the memory cell array has a 512×512 matrix, and other arrangements of the circuit are the same as those of the previous circuit.

The operation of the circuit shown in FIG. 13 will be described. When the memory cell side is not accessed, the specific word line $WL_j$ is selected by the row decoder 5. When a clock signal $\phi_S$ is enabled (high), all the gates $Q_0$ to $Q_{511}$ of the gate array 34 are turned ON, so that the contents of the memory cells connected to the word line $WL_j$ are transferred to the data latches $DL_0$ to $DL_{511}$ through the bit lines $BL_0$ to $BL_{511}$ and the gates $Q_0$ to $Q_{511}$. The clock signal $\phi_S$ is disabled after the above-mentioned data transfer period. Thereafter, the memory cells can be accessed.

Among the contents latched by the data latches $DL_0$ to $DL_{511}$, the contents of specific registers for the shift register array 34, e.g., $SR_i$ to $SR_{i+n}$ are subjected to the RMW operation. The shift registers $SR_0$ to $SR_{i-1}$ are kept OFF in response to signals $CL_0$ to $CL_{i-1}$ from the column decoder 24a, and the outputs from the shift registers $SR_0$ to $SR_{i-1}$ are kept OFF. Therefore, the gates $Q_{A0}$ to $Q_{A(i-1)}$ are kept off, and the contents of the data latches $DL_0$ to $DL_{i-1}$ are left unchanged. The shift registers $SR_i$ to $SR_{i+n}$ are sequentially turned ON in response to the signals $CL_i$ to $CL_{i+n}$ from the column decoder 24a. The gates $Q_{Ai}$ to $Q_{A(i+n)}$ are sequentially turned ON in response to the ON outputs $CL_i$ to $CL_{i+n}$. In this case, the input data $D_{in}$ is supplied to the data bus DB, and the contents modified by the modifying circuit 25a are sequentially latched by the data latches $DL_i$ to $DL_{i+n}$. The data latches $DL_{i+n+1}$ to $DL_{511}$ and $DL_0$ to $DL_{i-1}$ store the contents of the memory cells without modification. The modified contents within the range of bit lines $BL_i$ to $BL_{i+n}$ for the word line $WL_j$ are held in the data latches $DL_i$ to $DL_{i+n}$, while other latches store the contents of the memory cells without modification.

In this state, the clock signal $\phi_S$ is enabled for a predetermined period of time while the memory cells are not accessed. The gate array 31 is turned ON, and the contents of the data latch array 32 are stored in the memory cells connected to the word line $WL_j$. The modified contents can be stored in the memory cells within the range of bit lines $BL_i$ to $BL_{i+n}$. Other memory cells hold the previous data.

The same operations are performed for the word lines $WL_{j+1}$ to $WL_{j+m}$, and thus high-speed RMW operation can be performed for the specific memory cell area (m×n).

FIG. 14 shows a modification wherein the gate array 33 in FIG. 13 includes a gate array 35 consisting of gates $Q_{B0}$ to $Q_{B511}$ connected to an input data bus DB(I) and a gate array 33 consisting of gates $Q_{A0}$ to $Q_{A511}$ connected to an output data bus DB(O).

The contents of the memory cells temporarily transferred to data latches $DL_0$ to $DL_{511}$ are modified by the modifying circuit 25a together with the input data $D_{in}$ within the specific range of i to i+n, and the modified contents are latched by the data latches $DL_0$ to $DL_{511}$. The modified contents can be stored in the memory cells during the nonaccess mode of the memory cell array in the same manner as described above.

In this circuit, high-speed RMW operation can be performed for the memory contents for the specific memory cell area (m×n), and the contents of other memory cell areas can be left unchanged.

Many widely different embodiments of the present invention may be constructed without departing from the spirit and scope of the present invention. It should be understood that the present invention is not limited to the specific embodiments described in this specification, except as defined in the appended claims.

I claim:

1. A semiconductor memory device, comprising:
   a random access memory cell array including memory cells;
   data access means operatively connected to said memory cell array and including:
     one or more register circuit arrays, each having a data input and output circuit for simultaneously storing or reading data into or from said memory cells; and
     a data output circuit for serially reading a plurality of data from said memory cells; and
   one or more data modification circuits, each operatively connected to said corresponding register circuit array of said data access means, including at least one logical gate circuit and, successively receiving data from said data output circuit, modifying said receive data in a predetermined manner defined by said logical gate circuit and transmitting said modified data to said data input and output circuit.

2. A semiconductor memory device according to claim 1, wherein said data input and output circuit includes:
   first gates connected in parallel with each other and a first terminal of each first gate operatively connected to a corresponding memory cell selection line and each having a second terminal;
   first registers connected in parallel with each other and each connected to the second terminal of the corresponding gate; and
   a gate drive circuit driving simultaneously said first gates to simultaneously store or read said plurality of data into or from said memory cells.

3. A semiconductor memory device, comprising:
   a random access memory cell array including memory cells;
   data access means operatively connected to said memory cell array and including:
     one or more register circuit arrays, each having a data input and output circuit for simultaneously storing or reading data into or from said memory cells, each data input and output circuit including:
       first gates connected in parallel with each other and a first terminal of each first gate operatively connected to a corresponding memory cell selection line and each having a second terminal;

first registers connected in parallel with each other and each connected to the second terminal of the corresponding gate; and a gate drive circuit driving simultaneously said first gates, to simultaneously store or read data into or from said memory cells; and a data output circuit for serially reading plurality of data from said memory cells, said data output circuit including:

second gates connected in parallel with each other and each having first and second terminals;

second registers connected to said second gates;

an output amplifier connected to said second registers; and a gate drive circuit connected to said second gates; and the first terminal of each of said second gates operatively connected to a corresponding memory cell selection line and the second terminal connected to a corresponding register of said second registers, in data transfer mode, each of said registers operable independently of each other, said gate drive circuit simultaneously driving said second gates to simultaneously store data of said memory cells into said second registers, and in a data output mode, said second registers successively output stored data therein to said output amplifier; and one or more data modification circuits, each operatively connected to said corresponding register circuit array of said data access means, and successively receiving the data from said data output circuit, modifying said received data in a predetermined manner and transmitting said modified data to said data input and output circuit.

4. A semiconductor memory device according to claim 3, wherein said data modification circuit includes a logical operation circuit for a logical operation on one bit data from said data output circuit.

5. A semiconductor memory device, comprising:

a random access memory cell array including memory cells;

data access means operatively connected to said memory cell array and including:

one or more register circuit arrays, each having a data input and output circuit for simultaneously storing or reading data into or from said memory cells, each data input and output circuit including:

first gates connected in parallel with each other and a first terminal of each first gate operatively connected to a corresponding memory cell selection line and each having a second terminal;

first registers connected in parallel with each other and each connected to the second terminal of the corresponding gate, said first registers comprising shift registers; and a gate drive circuit driving simultaneously said first gates, to simultaneously store or read said data into or from said memory cells; and a data output circuit for serially reading data from said memory cells; and one or more data modification circuits, each operatively connected to said corresponding register circuit array of said data access means, and successively receiving the data from said data output circuit, modifying said receiving data in a predetermined manner and transmitting said modified data to said data input and output circuit.

6. A semiconductor memory device, comprising:

a random access memory cell array including memory cells;

data access means operatively connected to said memory cell array and including:

one or more register circuit arrays, each having a data input and output circuit for simultaneously storing or reading data into or from said memory cells, each data input and output circuit including:

first gates connected in parallel with each other and a first terminal of each first gate, operatively connected to a corresponding memory cell selection line and each having a second terminal;

first registers connected in parallel with each other and each connected to the second terminal of the corresponding gate, said first registers comprising flip-flops; and a gate drive circuit driving simultaneously said first gates, to simultaneously store or read said data into or from said memory cells;

a data output circuit for serially reading data from said memory cells; and one or more data modification circuits, each operatively connected to said corresponding register circuit array of said data access means, and successively receiving the data from said data output circuit, modifying said received data in a predetermined manner and transmitting said modified data to sid data input and output circuit.

7. A semiconductor memory device according to claim 3, wherein said first registers comprise shift registers.

8. A semiconductor memory device according to claim 3, wherein said plurality of first registers comprise flip-flops.

9. A semiconductor memory device, comprising:

a random access memory cell array including memory cells;

data access means operatively connected to said memory cell array and including:

one or more register circuit arrays, each having a data input and output circuit for simultaneously storing or reading data into or from said memory cells;

a data output circuit for serially reading data from said memory cells, each data input and output circuit including:

first gates connected in parallel with each other and a first terminal of each first gate operatively connected to a corresponding memory cell selection line and each having a second terminal;

first registers connected in parallel with each other and each connected in the second terminal of the corresponding gate; and a gate drive circuit driving simultaneously said first gates, to simultaneously store or read data into or from said memory cells; and a designating circuit, connected to said second registers, for designating a predetermined range for data output from said data output circuit and restore in said input circuit, to perform a predetermined range of data modification; and one or more data modification circuits, each operatively connected to said corresponding register circuit array of said data access means, and successively receiving the data from said data output circuit, modifying said received data in a predetermined manner and transmitting said modified data to said data input and output circuit.

10. A semiconductor memory device according to claim 9, wherein said designating circuit includes:
third gates connected to said second registers and in parallel with each other and each having first and second terminals;
third registers connected to said third gates; and
a decoder connected to said third registers, the first terminal of each of said third gates connected to the corresponding register of said data output circuit for applying data in said output circuit to said data modification circuit and the second terminal connected to the corresponding register of said data input and output circuit for restoring data modified by said data modification circuit, and said third registers successively activating said third gates in response to a command decoded by said decoder.

11. A semiconductor memory device according to claim 10, wherein said third registers comprise shift registers.

* * * * *